United States Patent
Nagarajan et al.

(10) Patent No.: US 10,461,066 B2
(45) Date of Patent: Oct. 29, 2019

(54) STRUCTURE AND METHOD FOR HYBRID OPTICAL PACKAGE WITH GLASS TOP COVER

(71) Applicant: Maxim Integrated Products, Inc., San Jose, CA (US)

(72) Inventors: Kumar Nagarajan, Cupertino, CA (US); Seshasayee S. Ankireddi, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 15/497,391

(22) Filed: Apr. 26, 2017

(65) Prior Publication Data

US 2018/0006003 A1    Jan. 4, 2018

Related U.S. Application Data

(60) Provisional application No. 62/356,237, filed on Jun. 29, 2016.

(51) Int. Cl.
| | | |
|---|---|---|
| *H01L 25/16* | (2006.01) | |
| *H01L 31/0203* | (2014.01) | |
| *H01L 31/024* | (2014.01) | |
| *H01L 31/18* | (2006.01) | |

(52) U.S. Cl.
CPC ........ *H01L 25/167* (2013.01); *H01L 31/0203* (2013.01); *H01L 31/024* (2013.01); *H01L 31/1892* (2013.01); *H01L 2224/97* (2013.01); *H01L 2924/16195* (2013.01)

(58) Field of Classification Search
CPC . H01L 25/165; H01L 25/167; H01L 31/0203; H01L 31/024; H01L 31/1892; H01L 25/112; H01L 25/0756; H01L 25/117
See application file for complete search history.

(56) References Cited

U.S. PATENT DOCUMENTS

| | | | | |
|---|---|---|---|---|
| 2003/0165303 A1* | 9/2003 | Pendse | ................ | H05K 1/0219 |
| | | | | 385/89 |
| 2005/0224946 A1* | 10/2005 | Dutta | ................ | G02B 6/12002 |
| | | | | 257/686 |
| 2008/0116379 A1* | 5/2008 | Teder | ................... | B60S 1/0822 |
| | | | | 250/341.1 |
| 2014/0361200 A1* | 12/2014 | Rudmann | ............... | H01L 25/50 |
| | | | | 250/578.1 |
| 2015/0115413 A1* | 4/2015 | Rudmann | ......... | H01L 27/14618 |
| | | | | 257/622 |
| 2016/0305817 A1* | 10/2016 | Kim | ......................... | G01J 1/08 |

* cited by examiner

*Primary Examiner* — Wael M Fahmy
*Assistant Examiner* — Sarah K Salerno
(74) *Attorney, Agent, or Firm* — Kevin E. West; Advent, LLP (57) ABSTRACT

An optical package containing optical sensor/detector pairs co-housed with a non-optical sensor and processes for fabricating the optical package are described herein. Traditional package structures require the use of clear mold compounds to protect the sensitive dies, but such compounds degrade with time and temperature. The optical package described herein uses a special glass top cover that is transparent in the entire electro-magnetic spectral region required by the contained dies.

18 Claims, 12 Drawing Sheets

FIG. 3L

STRUCTURE AND METHOD FOR HYBRID OPTICAL PACKAGE WITH GLASS TOP COVER

BACKGROUND

Electronic devices, such as smart phones, tablet computers, digital media players, and so forth, increasingly employ optical sensors to control the manipulation of a variety of functions provided by the device. For example, optical sensors are commonly used by electronic devices to detect ambient lighting conditions in order to control the brightness of the device's display screen. Similarly, optical sensors are commonly used in proximity and gesture sensing applications. Proximity and gesture sensing enables the detection of physical movement (e.g., "gestures") without the user actually touching the device within which the sensing device resides. The detected movements can be subsequently used as input commands for the device.

DRAWINGS

The Detailed Description is described with reference to the accompanying figures. The use of the same reference numbers in different instances in the description and the figures may indicate similar or identical items.

DETAILED DESCRIPTION

Overview

Traditional packages with sensor/detector pairs always have mold compounds as an encapsulant to protect the dies/wire bonds. These mold compounds are generally known to drift with extended time/temperature exposure. Additionally, when new functionality is added to an existing optical package using a non-optical sensor operating in a different region of the electromagnetic spectrum than the optical sensors, such mold compounds can no longer be used as they are opaque to the non-optical grade sensors.

Accordingly, an optical package containing optical sensor/detector pairs co-housed with a non-optical sensor and processes for fabricating the optical package are described herein. Traditional package structures require the use of clear mold compounds to protect the sensitive dies, but such compounds degrade with time and temperature. The optical package described herein uses a special glass top cover that is transparent in the entire electro-magnetic spectral region required by the contained dies.

In an implementation, an optical package that employs the techniques of the present disclosure includes a package substrate, the package substrate including at least one vent hole; an application specific integrated circuit die disposed on the package substrate, the application specific integrated circuit die including a detector; at least one non-optical sensor die disposed on the package substrate; a pre-molded polymer panel unit cell disposed on the package substrate, the pre-molded polymer panel unit cell including at least one cavity and at least one sidewall, the at least one sidewall configured to restrict cross talk between the application specific integrated circuit and the at least one non-optical sensor die; and an individual glass cover disposed on the pre-molded polymer panel unit cell.

In an implementation, a process for fabricating an optical package that employs the techniques of the present disclosure includes placing an application specific integrated circuit die on a panel level substrate, the panel level substrate including at least one vent hole; placing at least one non-optical sensor die on the panel level substrate; bonding a pre-molded polymer panel to the panel level substrate; and bonding at least one individual glass cover to the pre-molded polymer panel.

In an implementation, a process for fabricating an optical package that employs the techniques of the present disclosure includes placing an application specific integrated circuit die on a panel level substrate, the panel level substrate including at least one vent hole; placing at least one non-optical sensor die on the panel level substrate; placing a first adhesive film element on the panel level substrate; placing a pre-molded polymer panel on the first adhesive film element; placing a second adhesive film element on the pre-molded polymer panel; placing at least one individual glass cover on the second adhesive film element; and curing the first adhesive film element and the second adhesive film element.

The optical package and methods described herein create an integrated package where dies are protected from the external world by a glass cover lid. The glass cover lid is chosen carefully to be "transparent" to both optical and non-optical sensor elements of the package.

Example Implementations

Figure 1A:
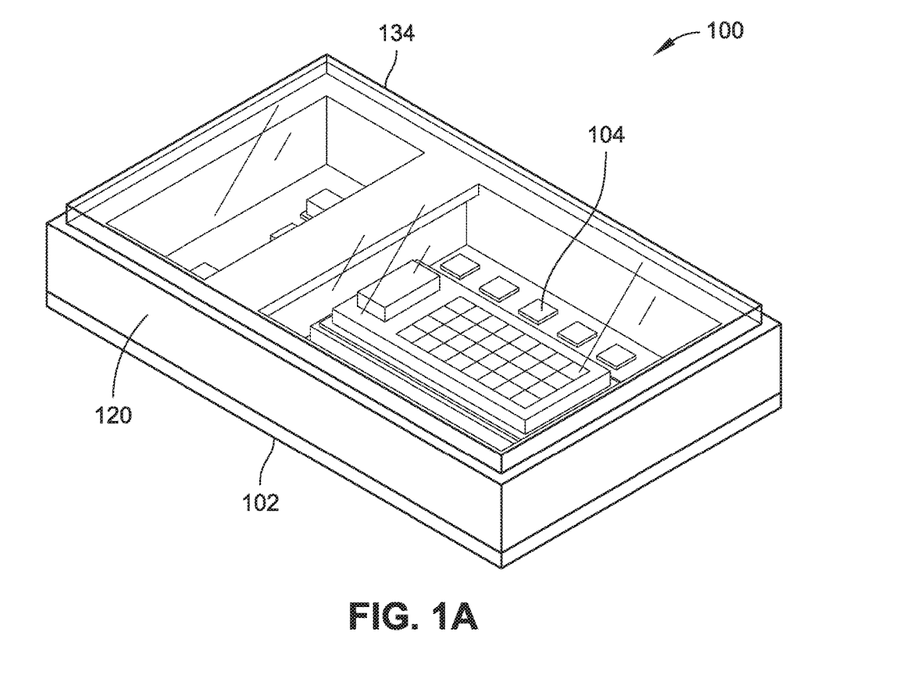
FIG. 1A is an isometric view of an optical package utilizing a pre-molded including panel and a glass cover in accordance with an embodiment of the present disclosure.
Figure 1B:
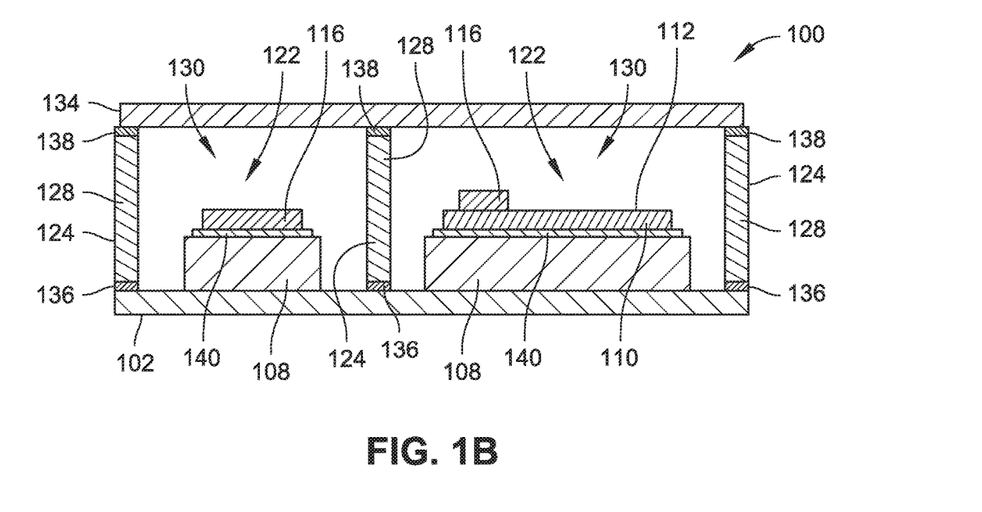
FIG. 1B is a partial side elevation cross sectional view of an optical package including a pre-molded polymer panel and a glass cover in accordance with an embodiment of the present disclosure.
Figure 1C:
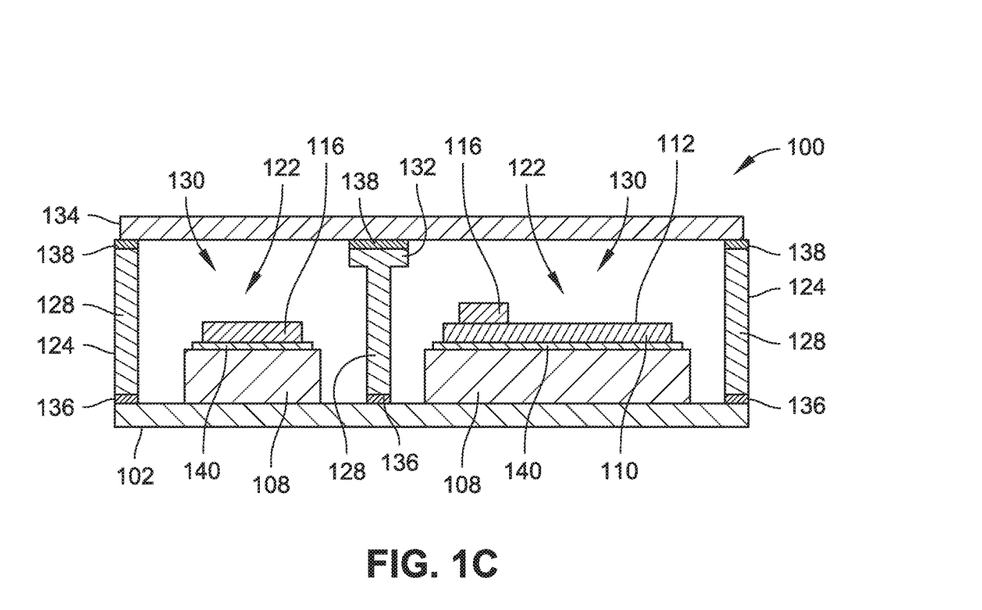
FIG. 1C is a partial side elevation cross sectional view of an optical package including a pre-molded polymer panel and a glass cover in accordance with an embodiment of the present disclosure.

FIGS. 1A through 1C illustrate an optical package 100 implemented in accordance with various embodiments of this disclosure. Those skilled in the art will appreciate that the embodiments illustrated in the drawings and/or described herein may be fully or partially combined to result in additional embodiments. Substitutions and other modifications can also be made without departing from the scope of this disclosure. Accordingly, the illustrated and described embodiments should be understood as explanatory and not as limitations of the present disclosure.

The optical package 100 can include a package substrate 102 configured to mechanically and/or electrically support the optical package 100. In implementations, the package substrate 102 can include, for example, a laminate and/or a ceramic material. In a specific example, the package substrate 102 can include a printed circuit board including FR-4 glass epoxy. In another specific example, the package substrate 102 can include a ceramic substrate. It is contemplated that the package substrate 102 can include other materials and components, such as a metal (e.g., aluminum) core board, a silicon substrate, a composite foil, vias, copper, signal traces, dielectric materials, etc. In some implementations, the package substrate 102 can include at least one vent hole 106 that extends through the package substrate 102. In these specific implementations, the at least one vent hole 106 can be configured to prevent substrate pop-corning during component reflow processes. The at least one vent hole 106 can be disposed at various locations of the package substrate 102, such as proximate to at least one non-optical sensor die 116 and/or proximate to an application specific integrated circuit (ASIC) die 110. Additionally, the package substrate 102 may include at least one contact pad 104 and/or a connection array 342 of contact pads.

In some implementations, the optical package 100 may include at least one pedestal 108 disposed on the package substrate 102. In these optional implementations, the pedestal 108 can function to elevate a die and/or a sensor from the package substrate 102, such as for field-of-view positioning. In embodiments, the pedestal 108 may include a spacer die and/or laminate/ceramic layers. In the embodiments illustrated in FIGS. 1A through 1C, the optical package 100 is illustrated with multiple pedestals 108. However, it is contemplated that the optical package 100 may not include pedestals 108 or may include a combination of sensors/dies with and without pedestals 108.

FIGS. 1A through 1C illustrate an optical package 100 including an ASIC die 110. In the implementations shown in FIGS. 1A through 1C, the ASIC die 110 is disposed on a pedestal 108 and a die attach pad 140 disposed on the pedestal 108. In other specific implementations, the ASIC die 110 can be disposed directly on the package substrate 102 or a die attach pad 140 that is on the package substrate 102. As used herein, the term "application specific integrated circuit die" can refer to a substrate constructed of materials such as, but not limited to, silicon, silicon dioxide, aluminum oxide, sapphire, germanium, gallium arsenide (GaAs), alloys of silicon and germanium, and/or indium phosphide (InP). Further, for the purposes of the present disclosure, a die and/or substrate can be formed as a semiconductor or an electrical insulator, and may include layers of both semiconducting and insulating material. For example, in implementations, a die/substrate can be formed using an insulator, such as silicon oxide, with a layer of semiconducting material, such as silicon formed thereupon. Electrical components, such as transistors and diodes, can be fabricated in the semiconductor to form integrated circuits. For example, the ASIC die 110 may include integrated circuits that can be electrically coupled to a contact pad (e.g., contact pad 104, die attach pad 140, etc.). In one specific embodiment, the ASIC die 110 includes a quad flat no-leads (QFN) die, although it is contemplated that the ASIC die 110 may include various other types of integrated circuit dies. Additionally, the ASIC die 110 can include at least one die pad configured as an electrical connection and can include other components.

Additionally, ASIC die 110 can include a detector 112. A detector 112 can include a portion of the ASIC die 110 that is configured to detect, for example, light. In a specific example, the detector 112 can include a photodetector. In another specific example, the detector 112 can include an infrared detector. It is contemplated that detector 112 can include other types of optical and/or non-optical detectors.

The optical package 100 can include at least one non-optical sensor die 116. The at least one non-optical sensor die 116 can be disposed directly on the package substrate 102 and/or on a die attach pad 140 disposed on the package substrate 102 and/or a pedestal 108. Some examples of a non-optical sensor die 116 can include an inertial sensor, a microphone, a temperature sensor, a pressure sensor, etc. In the specific embodiments depicted in FIGS. 1A through 1C, a non-optical sensor die 116 is disposed on a portion of the ASIC die 110 (e.g., not on detector 112). It is contemplated that other configurations may be implemented, such as an ASIC die 110 without a non-optical sensor die 116.

As illustrated in FIGS. 1A through 1C, the optical package 100 can include a pre-molded liquid crystal polymer panel unit cell 128. The pre-molded polymer panel unit cell 128 can include a pre-singulated portion of a pre-molded polymer panel 120 that is coupled to and disposed on a portion of the package substrate 102. Additionally, the pre-molded polymer panel unit cell 128 includes multiple cavities 122 and multiple sidewalls 124, which can form an opening 130. A single sidewall 124 can be coupled to another single sidewall 124 in repetition such that a cavity 122 is formed. In implementations, the cavity 122 can be configured to house at least one of an ASIC die 110, a non-optical sensor die 116, and/or other components. As shown in FIGS. 1A through 1C, the pre-molded polymer panel unit cell 128 includes sidewalls 124 that are coupled together to form a first cavity 122 that houses an ASIC die 110 and a second cavity 122 that houses multiple non-optical sensor dies 116. The pre-molded polymer panel unit cell 128 can include a material that is optically opaque and functions as a light-blocking material. In a specific embodiment, the pre-molded polymer panel unit cell 128 includes a liquid crystal polymer (LCP). It is contemplated that the pre-molded polymer panel unit cell 128 can include other materials, such as ceramic, silicon, epoxy, etc. In some embodiments, the pre-molded polymer panel unit cell 128 can be coupled to the package substrate 102 using a first adhesive film element 136. The first adhesive film element 136 can include, for example, a UV-curable glue or adhesive. It is contemplated that the pre-molded polymer panel unit cell 128 may be bonded to the package substrate 102 using other materials and/or methods.

In the specific embodiment shown in FIG. 1B, the pre-molded polymer panel unit cell 128 includes multiple sidewalls 124 that form an outer perimeter with a middle sidewall 124 that defines two cavities 122. An ASIC die 110 is disposed in the first cavity 122 and at least one non-optical sensor die 116 is disposed in the second cavity 122. In a similar specific embodiment, shown in FIG. 1C, a middle sidewall 124 includes a shelf structure 132. The shelf structure 132 can be formed at the top (e.g., distal from the package substrate 102) of the middle sidewall 124 and can include a cantilever configuration and/or overhang. In implementations, the shelf structure 132 can be cantilevered over one or multiple cavities. In some implementations, the shelf structure 132 can also be included with the perimeter sidewalls 124 of the pre-molded polymer panel unit cell 128.

An individual glass cover 134 is disposed on the pre-molded polymer panel unit cell 128. As illustrated in FIGS. 1A through 1C, the individual glass cover 134 can be adhesively bonded to the pre-molded polymer panel unit cell 128 using an adhesive, such as a second adhesive film element 138. In one instance, the second adhesive film element 138 and/or other adhesive may include a UV-curable glue. The second adhesive film element 138 may be formed as a panel level adhesive that is placed on the pre-molded polymer panel unit cell 128 prior to singulation. The individual glass cover 134 can include glass material that is transparent to the non-optical sensor die(s) 116, the ASIC die 110, and/or other components within the optical package 100.

Example Processes

Figure 2A:
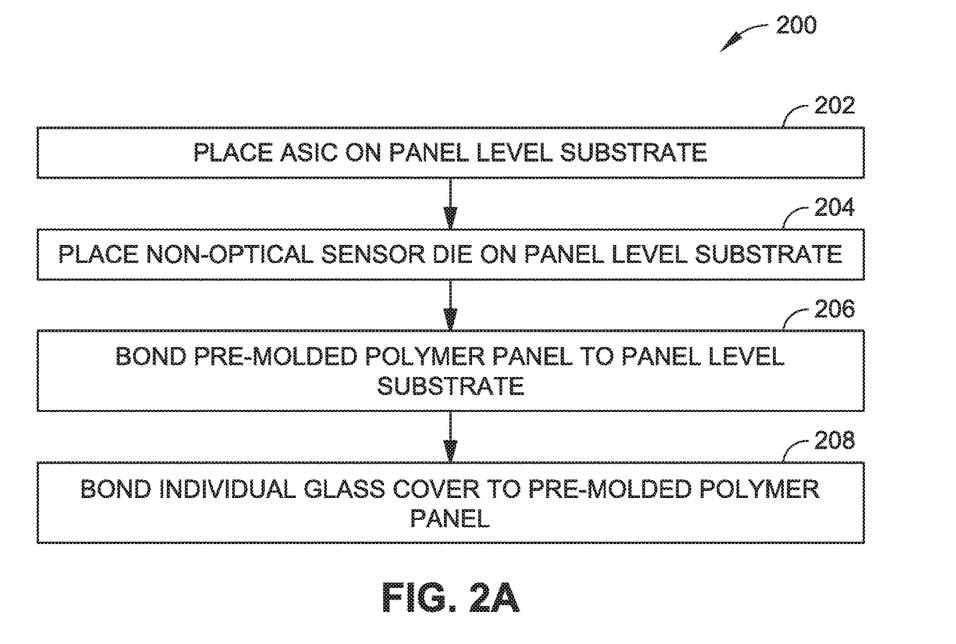
FIG. 2A is a flow diagram illustrating a process in an example implementation for fabricating an optical package including a pre-molded polymer panel and a glass cover in accordance with the present disclosure, such as the optical package shown in FIGS. 1A through 1C.
Figure 2B:
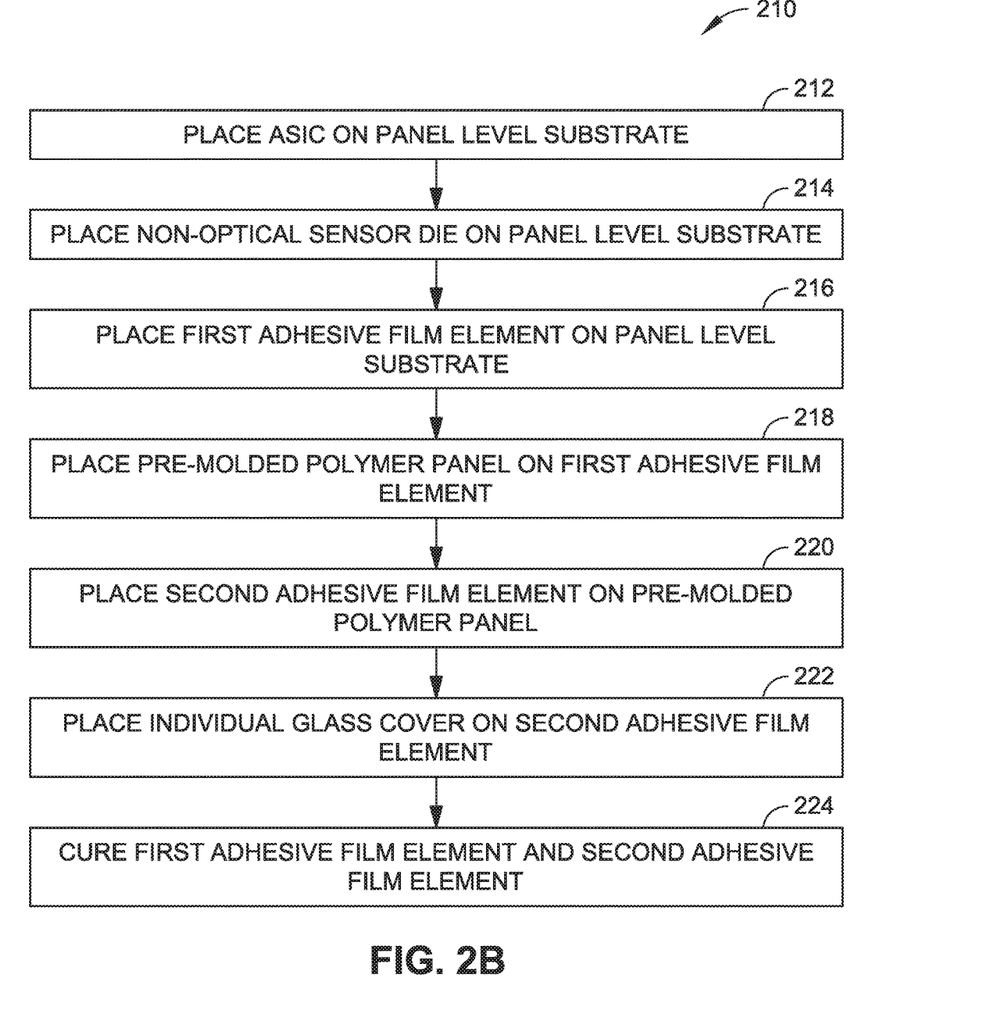
FIG. 2B is a flow diagram illustrating a process in an example implementation for fabricating an optical package including a pre-molded polymer panel and a glass cover in accordance with the present disclosure, such as the optical package shown in FIGS. 1A through 1C.

The following discussion describes example techniques for operating an optical package 100, such as those shown in FIGS. 1A through 1C. FIGS. 2A and 2B illustrate an example process 200 and an example process 210 for fabricating an optical package 100. FIGS. 3A through 3L illustrate a section 300 of an optical package and a panel level optical package array 126 during fabrication (such as the optical package 100 shown in FIGS. 1A through 1C).

In the process 200 illustrated in FIG. 2A, an application specific integrated circuit (ASIC) die is placed on a panel level substrate (Block 202). As illustrated in FIGS. 3A through 3D, placing an ASIC die 310 having a detector 312 on the panel level substrate 318 can include receiving a substrate (e.g., a printed circuit board, a laminate panel, a ceramic panel, etc.) having at least one die attach pad 340, at least one contact pad 304, a connection array 342, and at least one vent hole 306. In some embodiments, the receiving the panel level substrate 318 may include receiving a panel level substrate 318 having at least one pedestal 308 formed on the panel level substrate 318. A pedestal 308 can be configured to elevate a die (e.g., non-optical sensor die 316, ASIC die 310, etc.), often for field-of-view reasons. In some specific implementations, receiving the panel level substrate 318 may include forming at least one pedestal 308, which may further include placing and/or forming a spacer die, a laminate material, and/or a ceramic material. Further, placing an ASIC die 310 can include using a pick-and-place process for placing and/or coupling the ASIC die 310 to a die attach pad 340, a pedestal 308, and/or the panel level substrate 318.

Figure 3A:
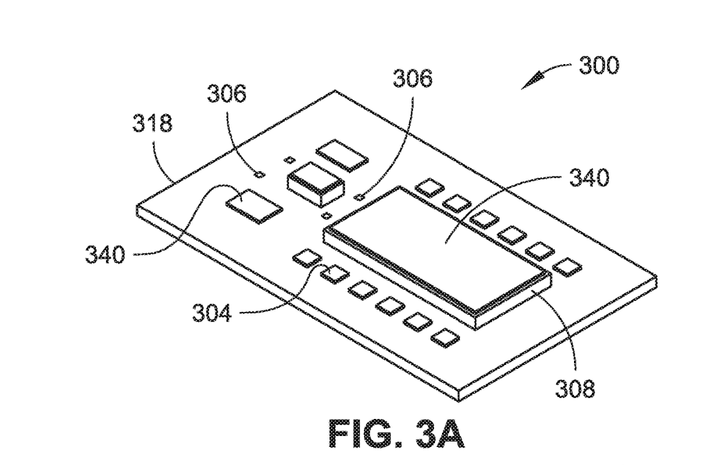
FIG. 3A is an isometric view illustrating the fabrication of an optical package, such as the optical package including a pre-molded polymer panel and a glass cover shown in FIGS. 1A through 1C, in accordance with the processes shown in FIGS. 2A and 2B.
Figure 3B:
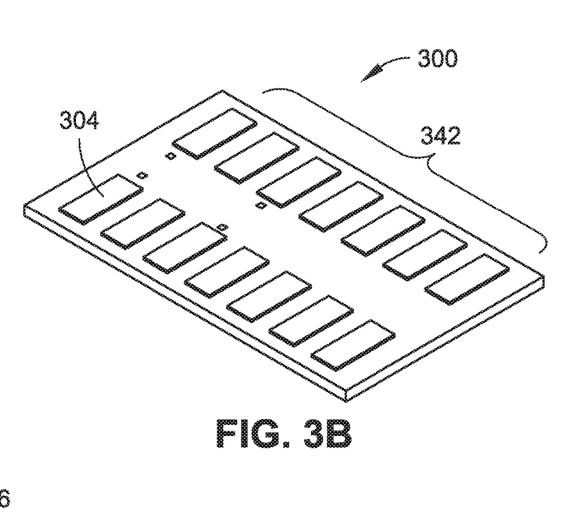
FIG. 3B is an isometric view illustrating the fabrication of an optical package, such as the optical package including a pre-molded polymer panel and a glass cover shown in FIGS. 1A through 1C, in accordance with the processes shown in FIGS. 2A and 2B.
Figure 3C:
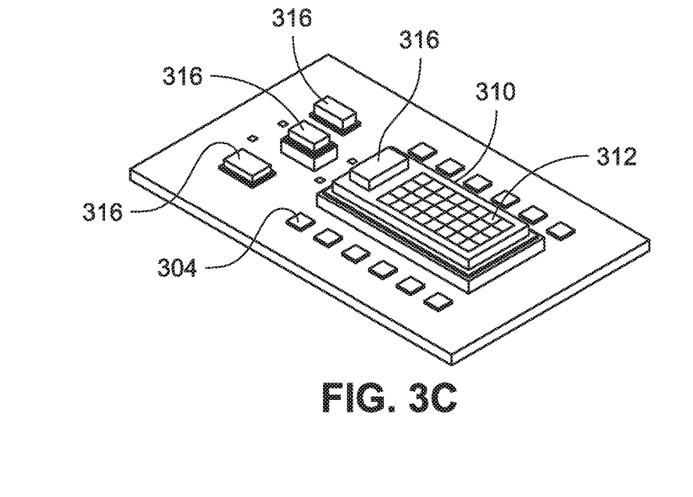
FIG. 3C is an isometric view illustrating the fabrication of an optical package, such as the optical package including a pre-molded polymer panel and a glass cover shown in FIGS. 1A through 1C, in accordance with the processes shown in FIGS. 2A and 2B.
Figure 3D:
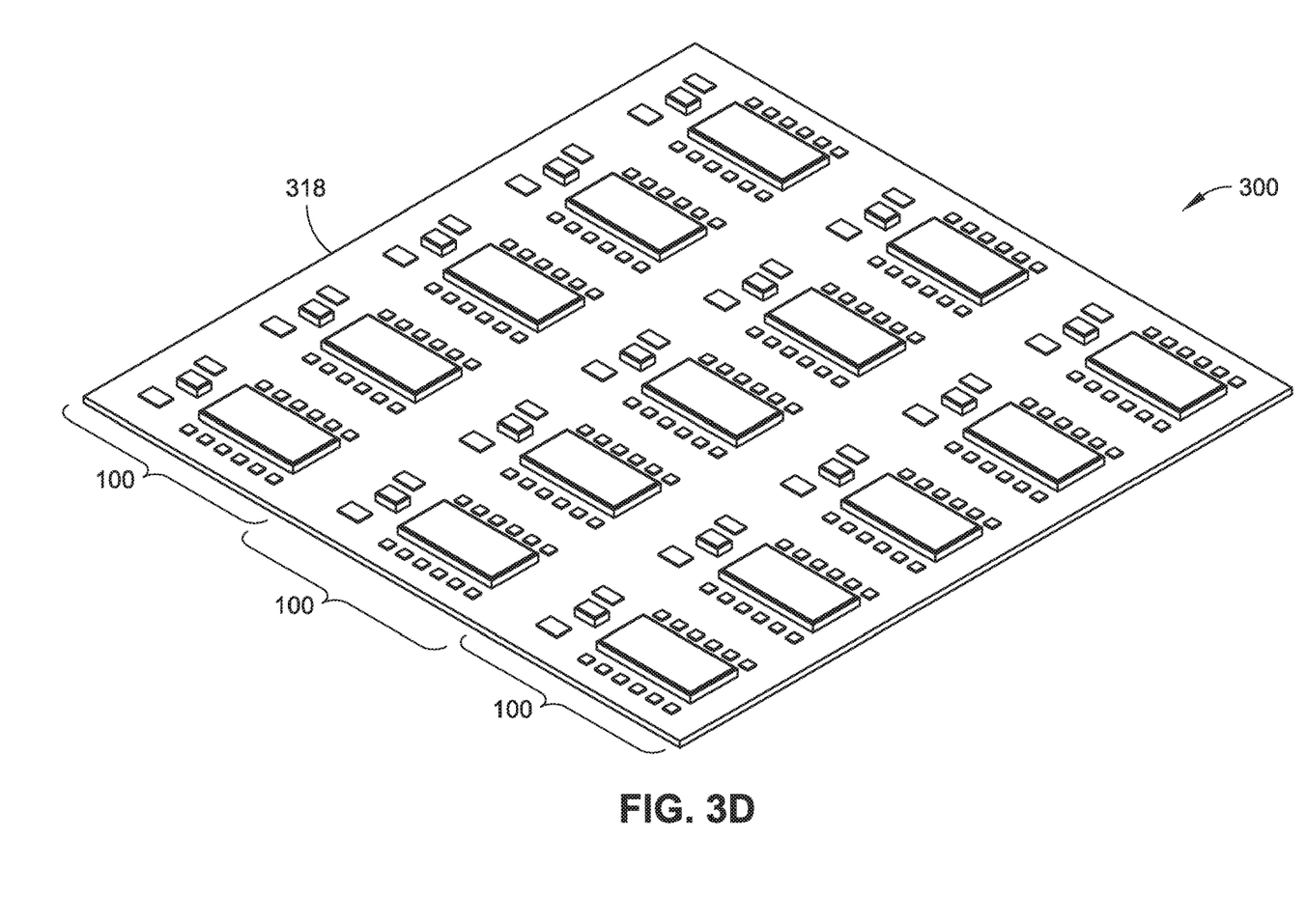
FIG. 3D is an isometric view illustrating the fabrication of an optical package, such as the optical package including a pre-molded polymer panel and a glass cover shown in FIGS. 1A through 1C, in accordance with the processes shown in FIGS. 2A and 2B.
Figure 3E:
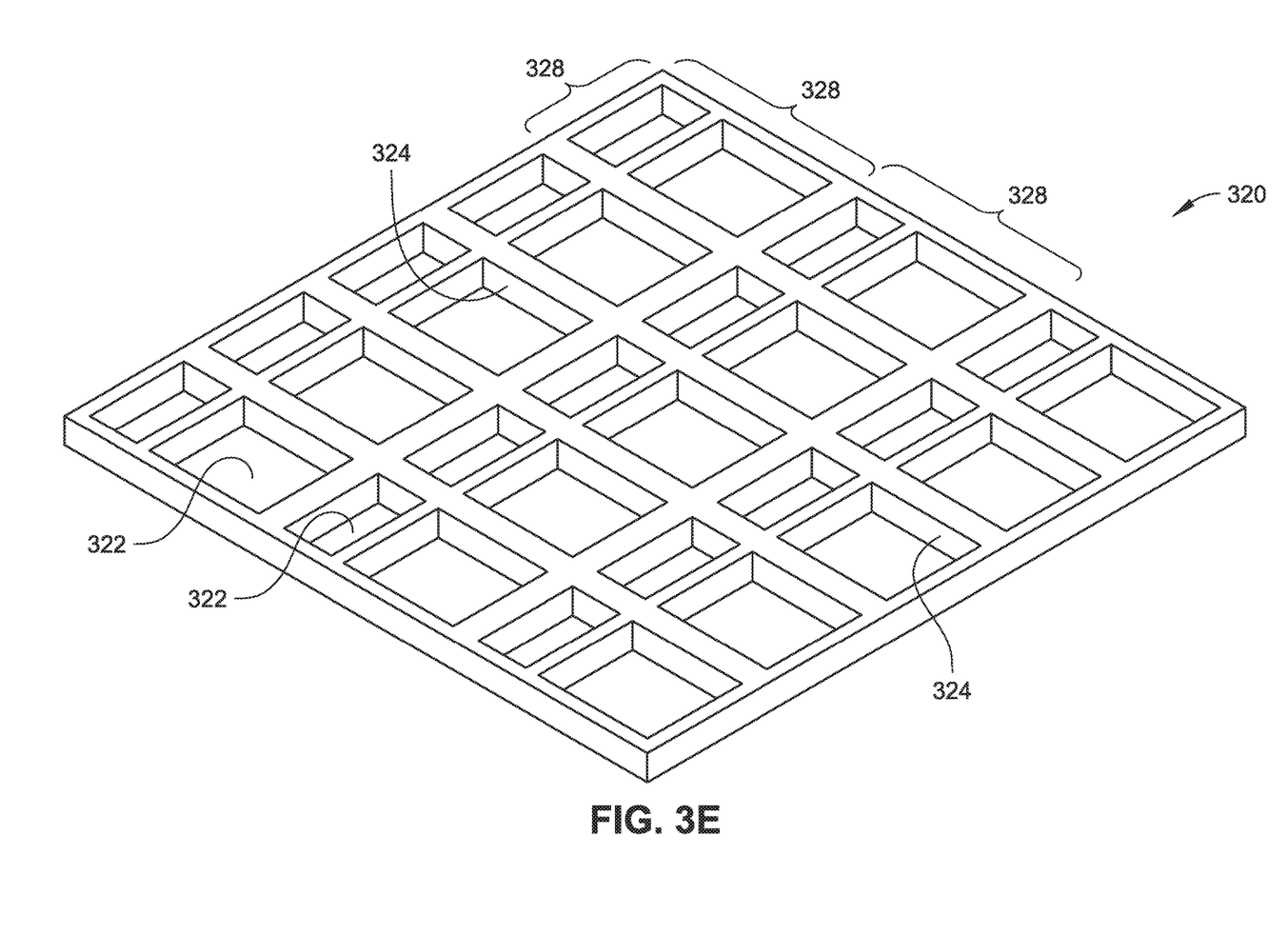
FIG. 3E is an isometric view illustrating the fabrication of an optical package, such as the optical package including a pre-molded polymer panel and a glass cover shown in FIGS. 1A through 1C, in accordance with the processes shown in FIGS. 2A and 2B.
Figure 3F:
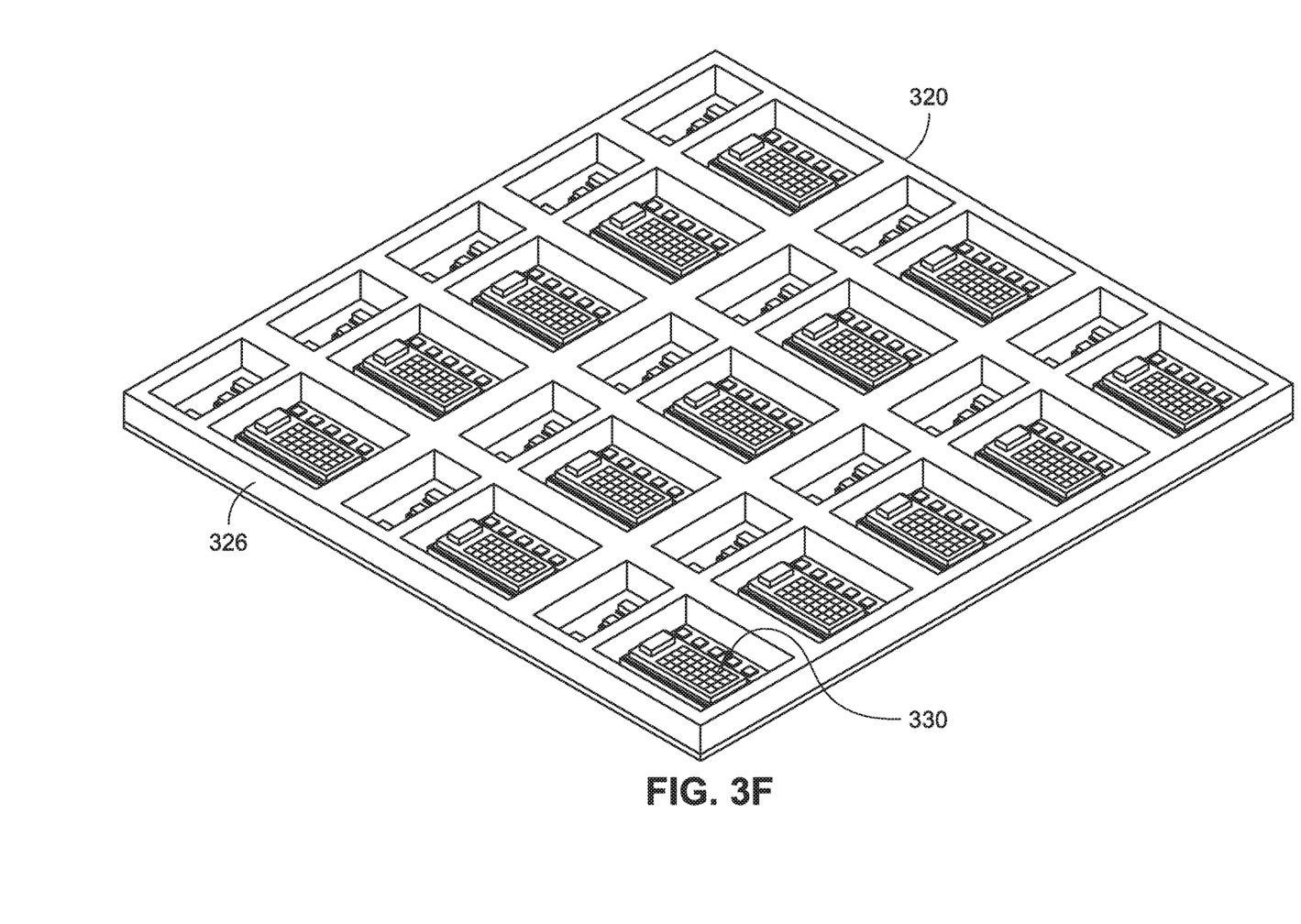
FIG. 3F is an isometric view illustrating the fabrication of an optical package, such as the optical package including a pre-molded polymer panel and a glass cover shown in FIGS. 1A through 1C, in accordance with the processes shown in FIGS. 2A and 2B.

Then, at least one non-optical sensor die is placed on the panel level substrate (Block 204). As illustrated in FIG. 3C, at least one non-optical sensor die 316 can be placed on the panel level substrate 318. Placing the at least one non-optical sensor die 316 may include using a pick-and-place process to place and/or attach the at least one non-optical sensor die 316 on the panel level substrate 318, a die attach pad 340, and/or a pedestal 308. The at least one non-optical sensor die 316 can be placed and positioned on the panel level substrate 318 so that, when a pre-molded polymer panel 320 is placed, the at least one non-optical sensor die 316 is disposed in a different cavity 322 than the ASIC die 310. In some specific instances, a non-optical sensor die 316 may be placed on the ASIC die 310, which may include a pick-and-place process.

Figure 3G:
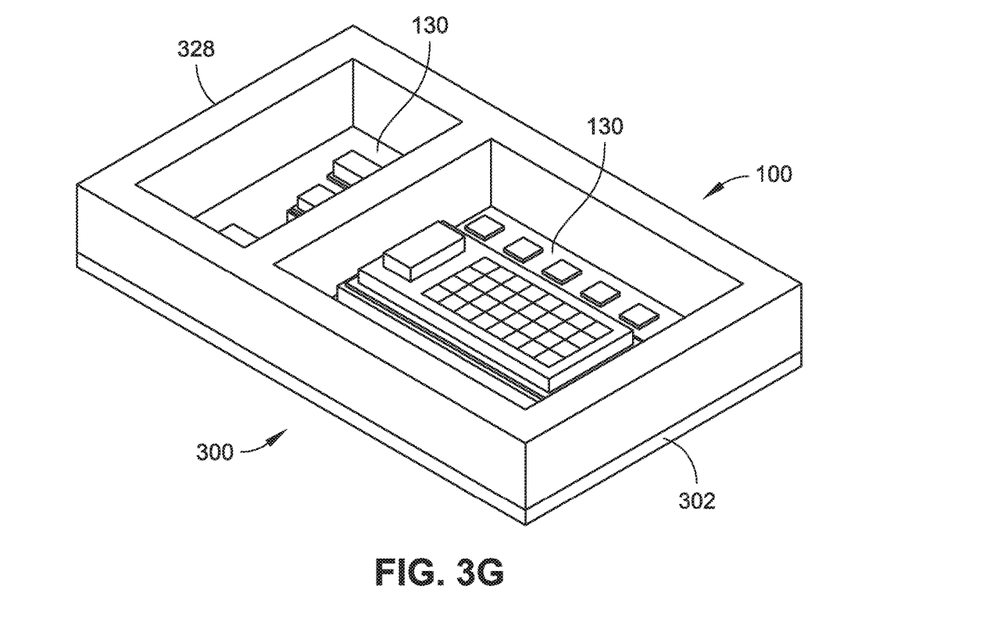
FIG. 3G is an isometric view illustrating the fabrication of an optical package, such as the optical package including a pre-molded polymer panel and a glass cover shown in FIGS. 1A through 1C, in accordance with the processes shown in FIGS. 2A and 2B.
Figure 3H:
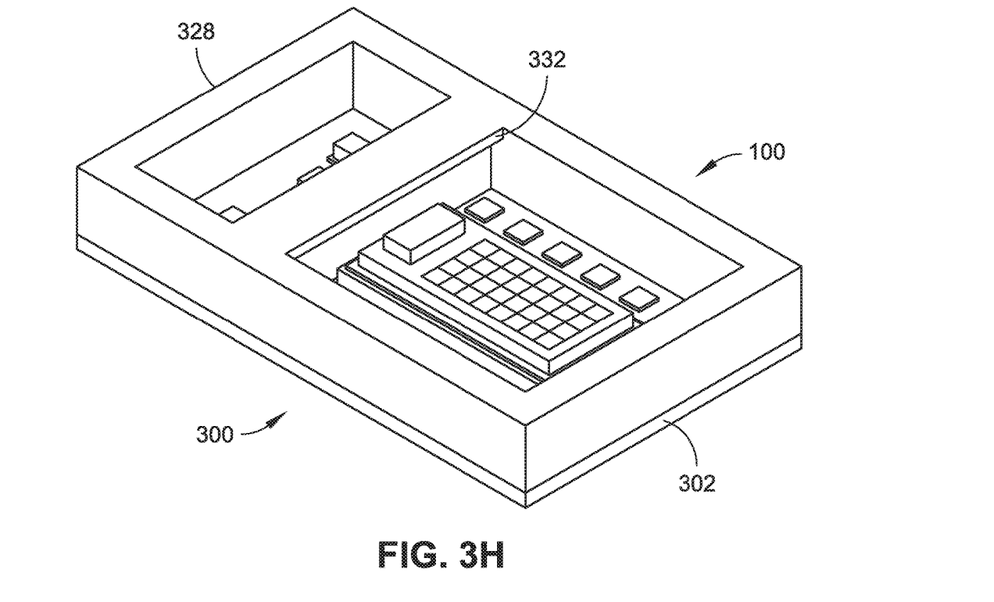
FIG. 3H is an isometric view illustrating the fabrication of an optical package, such as the optical package including a pre-molded polymer panel and a glass cover shown in FIGS. 1A through 1C, in accordance with the processes shown in FIGS. 2A and 2B.
Figure 3I:
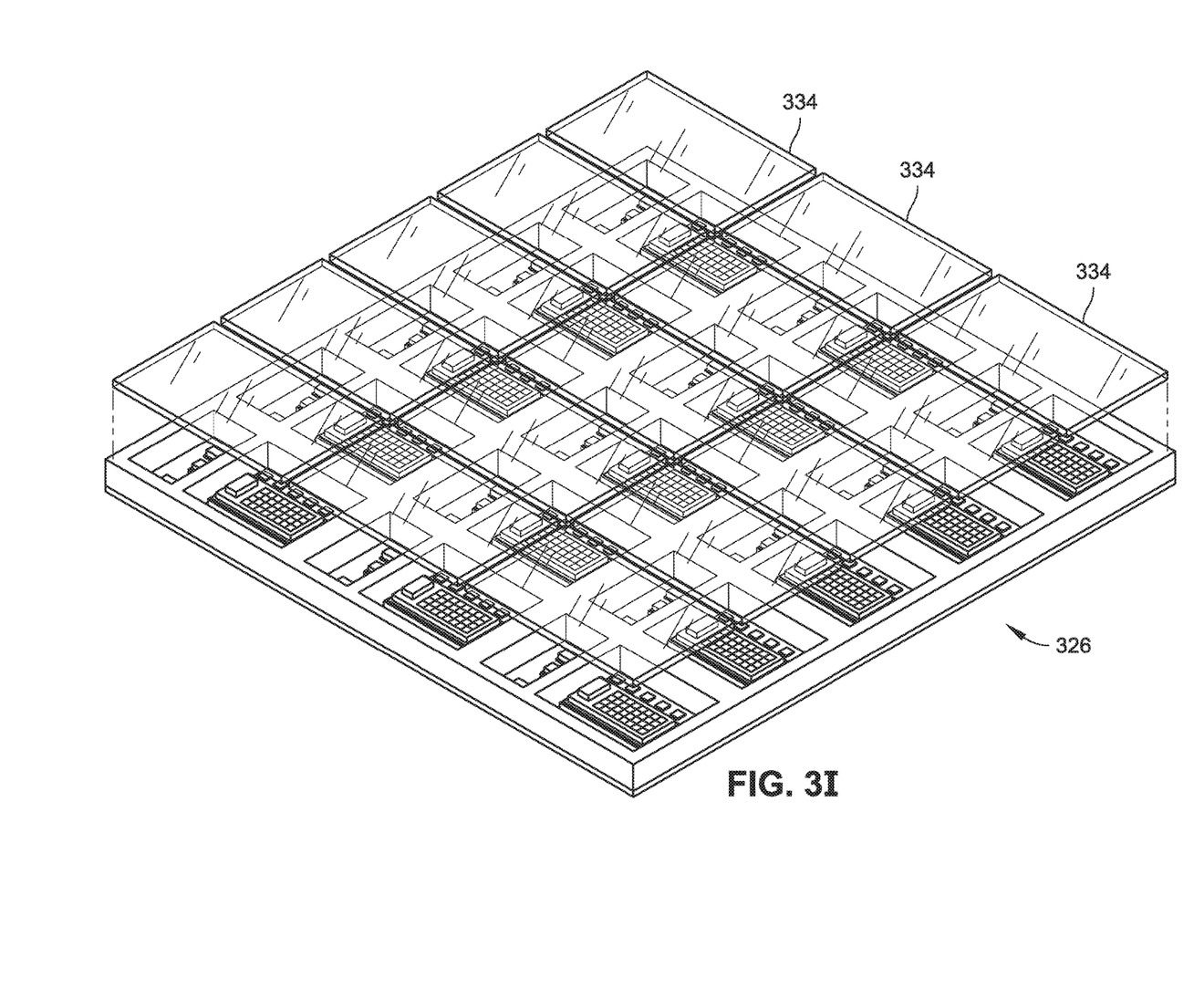
FIG. 3I is an isometric view illustrating the fabrication of an optical package, such as the optical package including a pre-molded polymer panel and a glass cover shown in FIGS. 1A through 1C, in accordance with the processes shown in FIGS. 2A and 2B.

A pre-molded polymer panel is bonded to the panel level substrate (Block 206). As illustrated in FIGS. 3E through 3H, a pre-molded polymer panel 320 can be bonded and coupled to the panel level substrate 318, using, for example, a pick-and-place process. In some implementations, the pre-molded polymer panel 320 can be coupled to the panel level substrate 318 using an adhesive, such as a UV-curable glue. Additionally, bonding and coupling the pre-molded polymer panel 320 can include aligning the pre-molded polymer panel 320 with the panel level substrate 318. FIG. 3G illustrates a partial panel level substrate 318, a partial pre-molded polymer panel 320, and a partial panel level optical package array 326. FIG. 3H illustrates a pre-molded polymer panel unit cell 328 showing a sidewall 324 having a shelf structure 332. Placing the pre-molded polymer panel 320 on the panel level substrate 318 defines an optical opening 330.

Next, at least one individual glass cover is bonded to the pre-molded polymer panel (Block 208). In implementations, multiple individual glass covers 334 can be bonded and coupled to the pre-molded polymer panel 320 and a pre-molded polymer panel unit cell 328. Bonding at least one individual glass cover 334 can include bonding an individual glass cover 334 that is transparent in the electro-magnetic spectral region detected by the ASIC die 310 and the non-optical sensor die 316.

In the process 210 illustrated in FIG. 2B, an application specific integrated circuit (ASIC) die is placed on a panel level substrate (Block 212). As illustrated in FIGS. 3A through 3D, placing an ASIC die 310 on the panel level substrate 318 can include receiving a substrate (e.g., a printed circuit board, a laminate panel, a ceramic panel, etc.) having at least one die attach pad 340, at least one contact pad 304, and at least one vent hole 306. In some embodiments, the receiving the panel level substrate 318 may include receiving a panel level substrate 318 having at least one pedestal 308 formed on the panel level substrate 318. A pedestal 308 can be configured to elevate a die (e.g., non-optical sensor die 316, ASIC die 310, etc.), often for field-of-view reasons. In some specific implementations, receiving the panel level substrate 318 may include forming at least one pedestal 308, which may further include placing and/or forming a spacer die, a laminate material, and/or a ceramic material. Further, placing an ASIC die 310 can include using a pick-and-place process for placing and/or coupling the ASIC die 310 to a die attach pad 340, a pedestal 308, and/or the panel level substrate 318.

Then, at least one non-optical sensor die is placed on the panel level substrate (Block 214). As illustrated in FIG. 3C, at least one non-optical sensor die 316 can be placed on the panel level substrate 318. Placing the at least one non-optical sensor die 316 may include using a pick-and-place process to place and/or attach the at least one non-optical sensor die 316 on the panel level substrate 318, a die attach pad 340, and/or a pedestal 308. The at least one non-optical sensor die 316 can be placed and positioned on the panel level substrate 318 so that, when a pre-molded polymer panel 320 is placed, the at least one non-optical sensor die 316 is disposed in a different cavity 322 than the ASIC die 310. In some specific instances, a non-optical sensor die 316 may be placed on the ASIC die 310, which may include a pick-and-place process.

A first adhesive film element is placed on the panel level substrate (Block 216). In the embodiment illustrated in FIGS. 3J and 3L, placing the first adhesive film element 336 can include placing a pre-formed panel level adhesive element that is formed and/or placed on the panel level substrate 318. In other specific embodiments, placing the first adhesive film element 336 can include placing a gel and/or liquid adhesive on the panel level substrate 318.

Figure 3J:
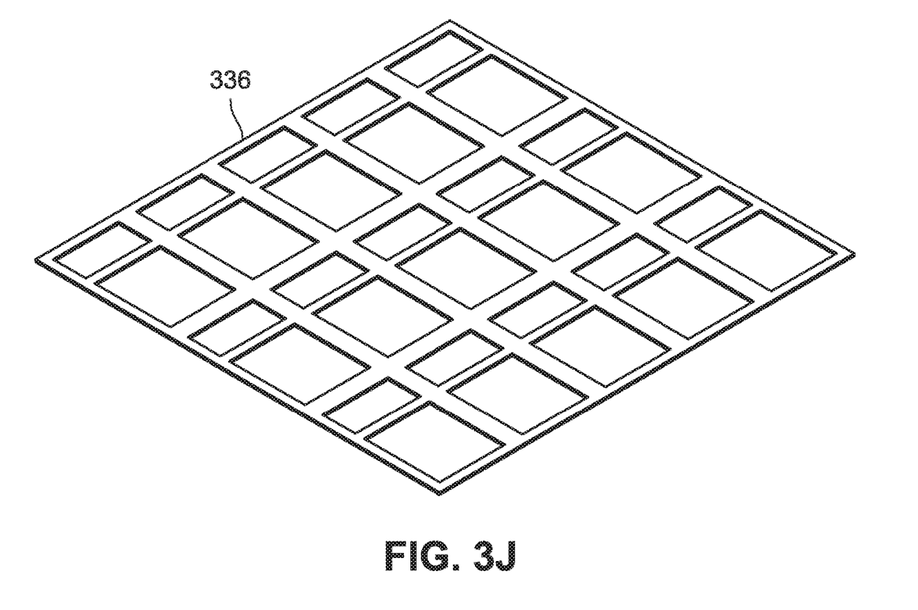
FIG. 3J is an isometric view illustrating the fabrication of an optical package, such as the optical package including a pre-molded polymer panel and a glass cover shown in FIGS. 1A through 1C, in accordance with the processes shown in FIGS. 2A and 2B.
Figure 3K:
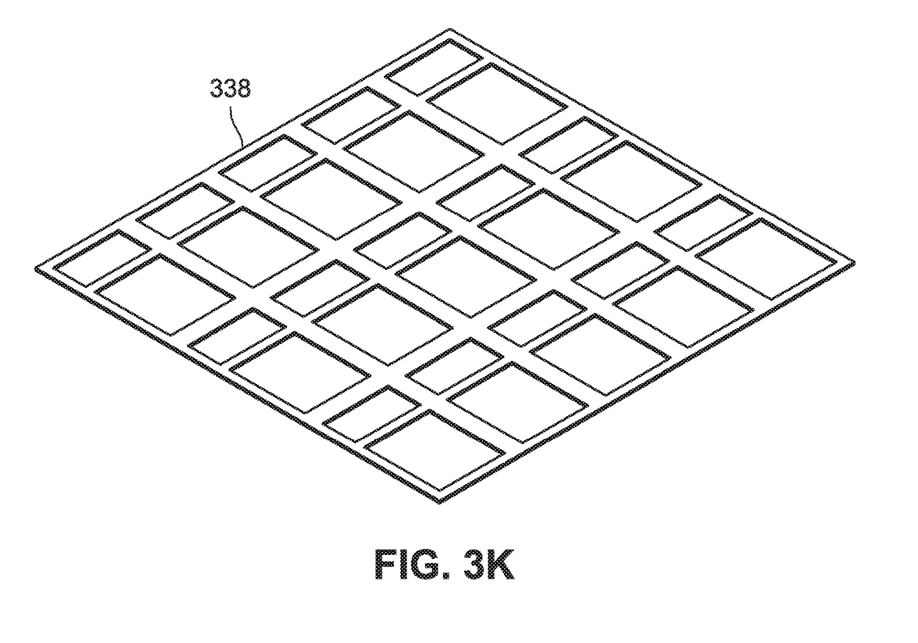
FIG. 3K is an isometric view illustrating the fabrication of an optical package, such as the optical package including a pre-molded polymer panel and a glass cover shown in FIGS. 1A through 1C, in accordance with the processes shown in FIGS. 2A and 2B.
Figure 3L:
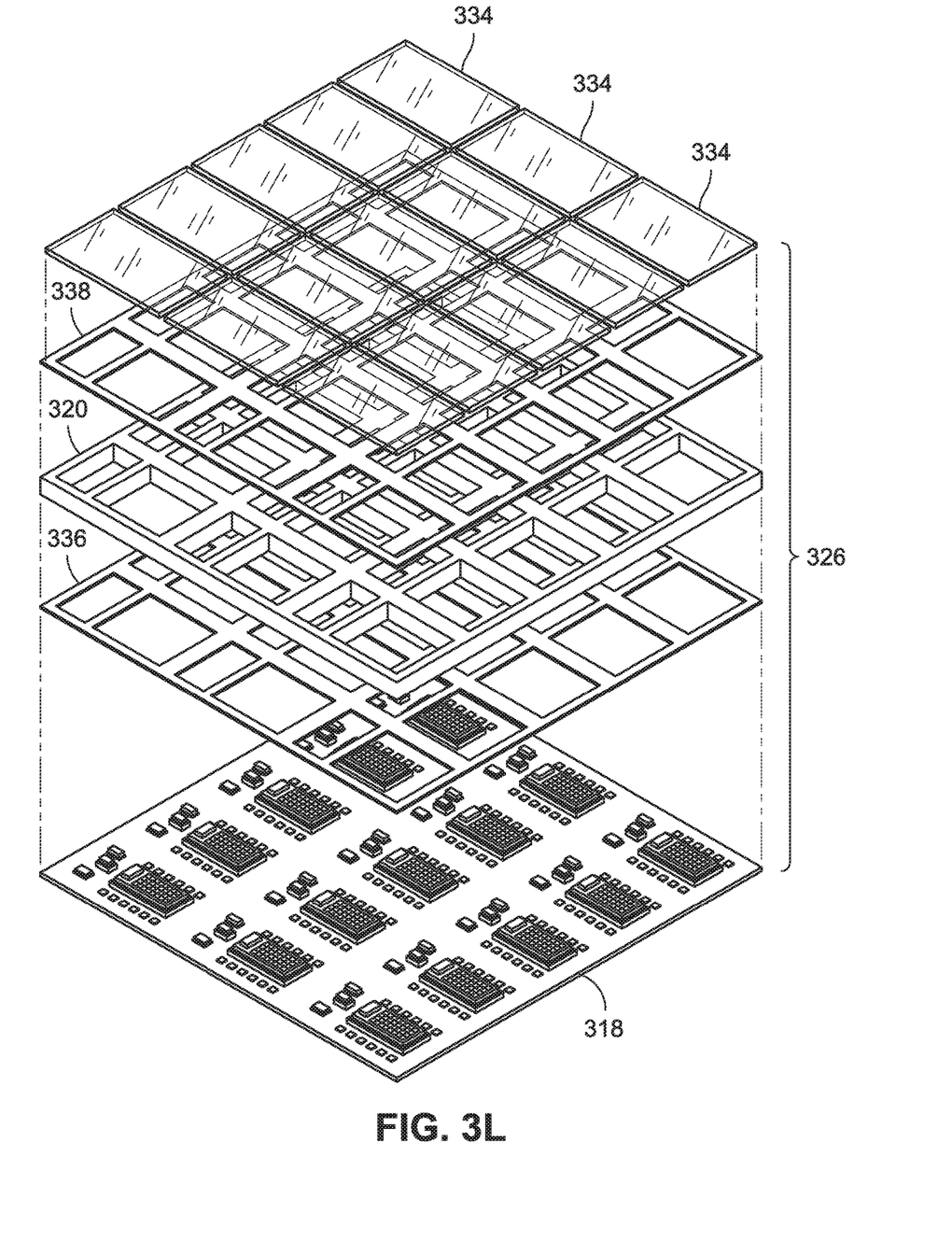
FIG. 3L is an isometric view illustrating the fabrication of an optical package, such as the optical package including a pre-molded polymer panel and a glass cover shown in FIGS. 1A through 1C, in accordance with the processes shown in FIGS. 2A and 2B.

Next, a pre-molded polymer panel is placed on the first adhesive film element and bonded to the panel level substrate (Block 218). As illustrated in FIGS. 3J and 3L, a pre-molded polymer panel 320 can be bonded and coupled to the first adhesive film element 336 and the panel level substrate 318, using, for example, a pick-and-place process. Additionally, bonding and coupling the pre-molded polymer panel 320 can include aligning the pre-molded polymer panel 320 with the first adhesive film element 336.

Subsequently, a second adhesive film element is placed on the pre-molded polymer panel (Block 220). In the embodiment illustrated in FIGS. 3K and 3L, placing the second adhesive film element 338 can include placing a pre-formed panel level adhesive element that is formed and/or placed on the pre-molded polymer panel 320. In other specific embodiments, placing the first adhesive film element 336 can include placing a gel and/or liquid adhesive on the pre-molded polymer panel 320.

An individual glass cover is placed on the second adhesive film element and the pre-molded polymer panel and second adhesive film element (Block 222). The individual glass cover 334 can be placed on the second adhesive film element 338 using, for example, a pick-and-place process. In implementations, multiple individual glass covers 334 can be bonded and coupled to the second adhesive film element 338 and a pre-molded polymer panel unit cell 328 (e.g., a portion of the pre-molded polymer panel 320). Bonding at least one individual glass cover 334 can include bonding an individual glass cover 334 that is transparent in the electro-magnetic spectral region detected by the ASIC die 310 and the non-optical sensor die 316.

Then, the first adhesive film element and the second adhesive film element is cured (Block 224). Curing the first adhesive film element 336 and/or the second adhesive film element 338 can include using a heating and/or an ultraviolet (UV) exposure process to cure and harden each adhesive on a panel level.

An additional process can include singulating individual optical packages 100 from the panel level optical package array 126. In an example, singulating the panel level optical package array 326 can include using a dicing saw to saw each individual optical package 100. Additionally, an optical package 100 may be coupled to another device (e.g., a printed circuit board, a microprocessor) to form a larger electronic device/system.

It is contemplated that other processes may be implemented in fabricating an optical package 100, such as soldering and reflow, placing an additional adhesive and/or glass cover, placing an optical filter on an individual glass cover 334, etc.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. An optical package, comprising:
 a package substrate comprising at least one of: at least one die attach pad, at least one vent hole configured to prevent pop-corning of the panel level substrate or at least one pedestal;
 an application specific integrated circuit (ASIC) die disposed on the package substrate, the application specific integrated circuit die including a detector;
 at least one non-optical sensor die disposed on the package substrate;
 a pre-molded polymer panel unit cell disposed on and coupled to the package substrate using a first adhesive film element, the pre-molded polymer panel unit cell including multiple sidewalls that form an outer perimeter and a middle sidewall that defines two cavities, the ASIC die disposed in a first cavity and the at least one non-optical sensor die disposed in a second cavity, the middle sidewall configured to restrict cross talk between the application specific integrated circuit die and the at least one non-optical sensor die, the middle sidewall further comprising a shelf-structure; and
 an individual glass cover disposed on the pre-molded polymer panel unit cell, where the glass cover is transparent to an electro-magnetic spectral region detected by the ASIC die and the at least one non-optical sensor die, the individual glass cover adhesively bonded directly to the pre-molded polymer panel unit cell using a second adhesive film element, the individual glass cover adhesively bonded directly to the shelf-structure using a third adhesive film element.
2. The optical package of claim 1, wherein the at least one vent hole extends through the package substrate.
3. The optical package of claim 1, wherein the package substrate comprises a laminate.

4. The optical package of claim 1, wherein the package substrate comprises a ceramic.

5. The optical package of claim 1, wherein at least one of the application specific integrated circuit die or the at least one non-optical sensor die is disposed on the at least one pedestal.

6. The optical package of claim 1, wherein the at least one pedestal includes a spacer die.

7. The optical package of claim 1, wherein the shelf-structure is cantilevered over at least one of the first cavity and the second cavity.

8. A process for fabricating an optical package, comprising:
    receiving a panel level substrate comprising at least one of: at least one die attach pad, at least one vent hole configured to prevent pop-corning of the panel level substrate or at least one pedestal;
    placing an application specific integrated circuit (ASIC) die having a detector on the panel level substrate;
    placing at least one non-optical sensor die on the panel level substrate;
    bonding a pre-molded polymer panel to the panel level substrate using a first adhesive film element, wherein the pre-molded polymer panel includes multiple sidewalls that form an outer perimeter and a middle sidewall that defines two cavities, the ASIC die disposed in a first cavity and the at least one non-optical sensor die disposed in a second cavity, the middle sidewall configured to restrict cross talk between the ASIC die and the at least one non-optical sensor die, the middle sidewall further comprising a shelf-structure;
    adhesively bonding at least one individual glass cover directly to the pre-molded polymer panel using a second adhesive film element, where the individual glass cover is transparent to an electro-magnetic spectral region detected by the ASIC die and the at least one non-optical sensor die;
    adhesively bonding the at least one individual glass cover directly to the shelf-structure using a third adhesive film element; and
    curing the first adhesive film element, the second adhesive film element, and the third adhesive film element.

9. The process for fabricating the optical package of claim 8, wherein the at least one vent hole extends through the panel level substrate.

10. The process for fabricating the optical package of claim 8, wherein the package substrate comprises a laminate.

11. The process for fabricating the optical package of claim 8, wherein the package substrate comprises a ceramic.

12. The process for fabricating the optical package of claim 8, further comprising:
    placing at least one of the application specific integrated circuit die or the at least one non-optical sensor die on the at least one pedestal.

13. The process for fabricating the optical package of claim 8, further comprising:
    placing the least one non-optical sensor die on the application specific integrated circuit die.

14. The process for fabricating the optical package of claim 8, further comprising:
    singulating the optical package from the panel level substrate.

15. A process for fabricating an optical package, comprising:
    receiving a panel level substrate comprising at least one of: at least one die attach pad, at least one vent hole configured to prevent pop-corning of the panel level substrate or at least one pedestal;
    placing an application specific integrated circuit (ASIC) die having a detector on the panel level substrate;
    placing at least one non-optical sensor die on the panel level substrate;
    placing a first adhesive film element on the panel level substrate;
    placing a pre-molded polymer panel on the first adhesive film element, wherein the pre-molded polymer panel includes multiple sidewalls that form an outer perimeter and a middle sidewall that defines two cavities, the ASIC die disposed in a first cavity and the at least one non-optical sensor die disposed in a second cavity, the middle sidewall configured to restrict cross talk between the ASIC die and the at least one non-optical sensor die, the middle sidewall further comprising a shelf-structure;
    placing a second adhesive film element on the pre-molded polymer panel;
    placing a third adhesive film element on the shelf-structure;
    placing at least one individual glass cover directly on the second adhesive film element and directly on the third adhesive film element, where the individual glass cover is transparent to an electro-magnetic spectral region detected by the ASIC die and the at least one non-optical sensor die; and
    curing the first adhesive film element, the second adhesive film element, and the third adhesive film element.

16. The process for fabricating the optical package in claim 15, further comprising:
    singulating the optical package from the panel level substrate.

17. The process for fabricating the optical package of claim 15, wherein the package substrate comprises a laminate.

18. The process for fabricating the optical package of claim 15, wherein the package substrate comprises a ceramic.

* * * * *

UNITED STATES PATENT AND TRADEMARK OFFICE
CERTIFICATE OF CORRECTION

PATENT NO. : 10,461,066 B2
APPLICATION NO. : 15/497391
DATED : October 29, 2019
INVENTOR(S) : Kumar Nagarajan and Seshasayee S. Ankireddi Page 1 of 2

It is certified that error appears in the above-identified patent and that said Letters Patent is hereby corrected as shown below:

In the Claims

Column 8, Line 37, Claim 1:
". . . prevent pop-corning of the panel level substrate or at. . ."
Should read:
-- prevent pop-corning of a panel level substrate or at --

Column 8, Line 40 - 41, Claim 1:
". . . the application specific integrated circuit die including a detector. . ."
Should read:
-- the ASIC die including a detector --

Column 8, Line 52, Claim 1:
". . .between the application specific integrated circuit die. . ."
Should read:
-- between the ASIC die --

Column 9, Line 4, Claim 5:
". . . the application specific integrated circuit die or the at least. . ."
Should read:
-- the ASIC die or the at least --

Column 9, Line 16, Claim 8:
". . . configured to prevent pop-corning of the panel level. . ."
Should read:
-- configured to prevent pop-corning of a panel level --

Column 9, Line 53-54, Claim 12:
". . . placing at least one of the application specific integrated circuit die or the at least one non-optical sensor die on. . ."

Signed and Sealed this
Sixteenth Day of June, 2020

Andrei Iancu
*Director of the United States Patent and Trademark Office*

Should read:
-- placing at least one of the ASIC die or the at least one non-optical sensor die on --

Column 10, Line 3-4, Claim 13:
". . . placing the least one non-optical sensor die on the application specific integrated circuit die. . ."
Should read:
-- placing the least one non-optical sensor die on the ASIC die --

Column 10, Line 14, Claim 15:
". . . configured to prevent pop-corning of the panel level. . ."
Should read:
-- configured to prevent pop-corning of a panel level --